United States Patent [19]
Takashima et al.

[11] Patent Number: 6,013,133
[45] Date of Patent: *Jan. 11, 2000

[54] ELECTRONIC COMPONENT HOLDER

[75] Inventors: Hiroyoshi Takashima; Norio Sakai, both of Nagaokakyo, Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/229,726

[22] Filed: Apr. 19, 1994

[30] Foreign Application Priority Data

Apr. 20, 1993 [JP] Japan .................................. 5-093342

[51] Int. Cl.⁷ .............................. B05C 3/02; H01B 1/00; H01B 1/02
[52] U.S. Cl. ...................... 118/500; 118/503; 174/138 G; 174/138 R
[58] Field of Search ..................................... 118/500, 503; 269/40, 43, 900, 903; 211/41; 174/138 G, 138 R; 361/807, 809, 810, 811, 12; 29/760

[56] References Cited

U.S. PATENT DOCUMENTS

| | | | |
|---|---|---|---|
| 2,733,289 | 1/1956 | Warren et al. ......................... | 174/99 B |
| 3,612,749 | 10/1971 | Grube et al. ......................... | 174/138 G |
| 4,393,808 | 7/1983 | Braden ..................................... | 118/503 |
| 4,420,795 | 12/1983 | Scholz ..................................... | 361/825 |
| 4,526,129 | 7/1985 | Braden ..................................... | 118/500 |
| 4,664,943 | 5/1987 | Nitta et al. ............................. | 118/503 |
| 4,900,586 | 2/1990 | Kanamori et al. ...................... | 118/503 |
| 5,085,362 | 2/1992 | Art et al. ................................ | 228/49.1 |
| 5,383,997 | 1/1995 | Minowa et al. ......................... | 118/500 |

FOREIGN PATENT DOCUMENTS

| | | | |
|---|---|---|---|
| 0456426 | 11/1991 | European Pat. Off. ............... | 118/500 |
| 0237399 | 7/1986 | Germany ................................. | 269/40 |
| 5109877 | 4/1993 | Japan ..................................... | 118/500 |

*Primary Examiner*—Kristine Kincaid
*Assistant Examiner*—Mark Olds
*Attorney, Agent, or Firm*—Ostrolenk, Faber, Gerb & Soffen, LLP

[57] ABSTRACT

An electronic component holder has a recess portion opening outward in at least one of its edges and having dimensions corresponding to the dimensions of an electronic component chip to constitute an electronic component holding portion. At least one pair of inner side surfaces opposed to each other of the recess portion are each composed of an elastic material.

15 Claims, 10 Drawing Sheets

ELECTRONIC COMPONENT HOLDER

BACKGROUND OF THE INVENTION

1. Field of the Invention

The present invention relates to an electronic component holder suited to hold an electronic component and particularly, a chip-type electronic component, and an electronic component handling method using the electronic component holder.

2. Description of the Prior Art

For example, in the fabricating processes of a chip-type electronic component such as a chip-type multilayer capacitor, an electronic component holder shown in FIG. 2 has been used in forming outer electrodes on both end surfaces of an electronic component chip or connecting a measuring circuit between the outer electrodes to measure electrical properties.

The electronic component holder 2 has a structure in which an adhesive surface 2b is formed by affixing an adhesive tape to one of the end surfaces of a rigid supporting plate 2a composed of a metal or synthetic resin.

In using the electronic component holder 2, an electronic component chip 3 is fixed to the above described adhesive surface 2b utilizing adhesive power as shown to, for example, form outer electrodes or measure electrical properties.

In the conventional electronic component holder 2, when the electronic component chip 3 is removed after forming the outer electrodes or measuring the electrical properties, pressure sensitive adhesives are moved toward the electronic component chip 3, whereby the surface of the electronic component chip 3 becomes dirty. Particularly if the pressure sensitive adhesives are greatly moved, the removed electronic component chip 3 is liable to adhere to another removed electronic component chip 3, or surrounding dust or the like is liable to adhere to the electronic component chip 3.

Furthermore, the degradation of the adhesive power of the adhesive surface 2b may proceed rapidly depending on the method. For example, when the outer electrodes are formed utilizing the step of applying a conductive paste made of a thick film and drying the same, the electronic component holder 2 is repeatedly passed through a high-temperature atmosphere. As a result, the adhesive power of the adhesive surface 2b is significantly degraded, whereby the electronic component chip 3 may, in some cases, be dropped from the holder 2.

Additionally, the adhesive power of the adhesive surface 2b is liable to be degraded by the lapse of time. If the adhesive power is utilized for, for example, forming the outer electrodes, therefore, the adhesive surface 2b must be formed again after approximately 20 cycles, resulting in high cost.

On the other hand, when an electronic component holder 2 is used to form outer electrodes in both ends of an electronic component chip 3, the length L of the electronic component chip 3 must be made more than the thickness T of the electronic component holder 2, as shown in FIG. 3. If the above described thickness T is decreased, an area for holding the electronic component chip 3 is decreased. Moreover, since the electronic component chip 3 is held only on its one surface, the electronic component chip 3 may not, in some cases, be stably held as shown in FIG. 4, to be used for the step of forming the outer electrodes or the step of measuring electrical properties in an inclined position. As a result, in some cases, the outer electrodes cannot be reliably formed in a desired shape or the electrical properties cannot be measured with high precision.

Furthermore, in recent years, miniaturization of the electronic component has proceeded rapidly. If the length L of the electronic component chip 3 becomes significantly small, i.e., not more than 3 mm, it is extremely difficult to hold the electronic component chip 3 in the electronic component holder 2.

SUMMARY OF THE INVENTION

An object of the present invention is to provide an electronic component holder capable of stably holding an electronic component in a desired direction without making the electronic component dirty and an electronic component handling method using the electronic component holder.

According to the present invention, there is provided an electronic component holder in which at least one recess portion opening outward in at least one of its edges and having dimensions corresponding to the dimensions of an electronic component is formed to constitute an electronic component holding portion, and at least one pair of side surfaces opposed to each other of the recess portion are each composed of an elastic material.

Accordingly, an electronic component having a width equal to or slightly more than the distance between the pair of side surfaces of the recess portion is pressed into the recess portion, thereby to make it possible to reliably hold the electronic component.

Furthermore, the above described electronic component is held by the contact of at least one pair of side surfaces, which are each composed of the elastic material, with the surface of the electronic component, so that pressure sensitive adhesives or the like do not adhere to the surface of the electronic component after the electronic component is removed. Consequently, the adhesion of foreign matter to the electronic component and the adhesion of the electronic component to another electronic component can be reliably prevented, thereby to make it possible to improve the reliability of the chip-type electronic component.

Moreover, the electronic component is elastically held between at least one pair of inner side surfaces opposed to each other of the recess portion, so that holding power is stable, and the electronic component held is not easily dropped and the position thereof is not easily shifted. Accordingly, it is possible to reliably form the outer electrodes or measure the electrical properties thereby to make it possible to increase the yield of the electronic component.

Furthermore, the electronic component holder is superior in life characteristics because it does not utilize pressure sensitive adhesives. If silicone rubber is used as an elastic material composing the pair of inner side surfaces of the recess portion, for example, the life can be significantly lengthened, as compared with the conventional electronic component holder and consequently, the manufacturing cost of the electronic component can be reduced.

Additionally, the electronic component is held in elastic contact in the recess portion, so that the electronic component can be also moved without being removed from the recess portion. Accordingly, after the electronic component is held in the recess portion, the position of the electronic component can be shifted, thereby to make it possible to position the electronic component again. Particularly, the electronic component can be accurately positioned in the center of the electronic component holding portion, thereby to make it possible to effectively increase the precision of, for example, formation of outer electrodes or measurement of electrical properties.

In accordance with another aspect of the present invention, there is provided an electronic component handling method comprising the step of inserting into an electronic component holding portion of an electronic component holder an electronic component having dimensions corresponding to the electronic component holding portion and holding the electronic component therein, and the step of handling the electronic component with the electronic component held in the electronic component holding portion.

The electronic component handling method according to the present invention comprises the above described suitable steps carried out while holding the electronic component in the electronic component holding portion. Examples are the step of forming outer electrodes and the step of measuring electrical properties.

Furthermore, in the electronic component handling method according to the present invention, the electronic component is held in the electronic component holding portion and then, the outer electrodes are formed or the electrical properties are measured with the electronic component held therein. Consequently, the above described handling step is carried out with the electronic component held in the electronic component holding portion, thereby to make it possible to reliably form the outer electrodes or measure the electrical properties without making the electronic component dirty.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment will be described with reference to the drawings, to clarify the present invention.

Figure 1:
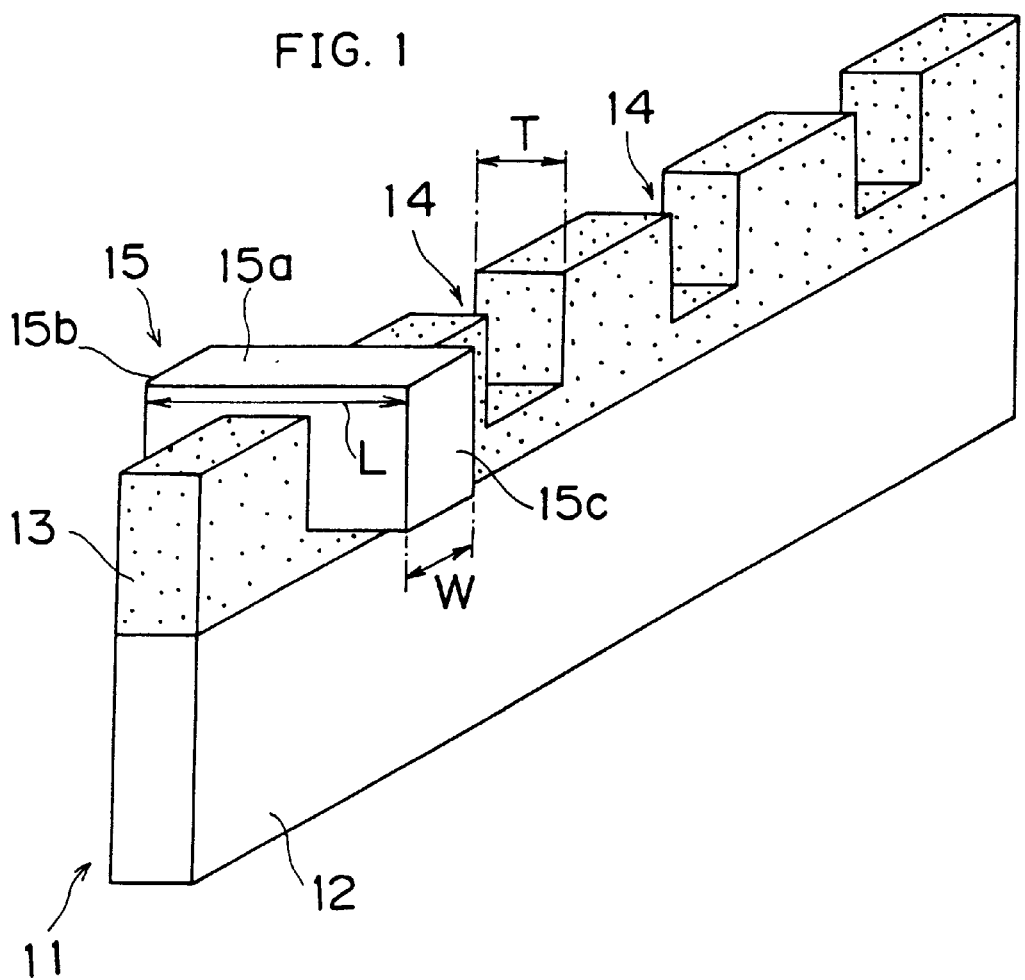
FIG. 1 is a perspective view showing a chip-type electronic component held in an electronic component holder according to the present embodiment.
Figure 2:
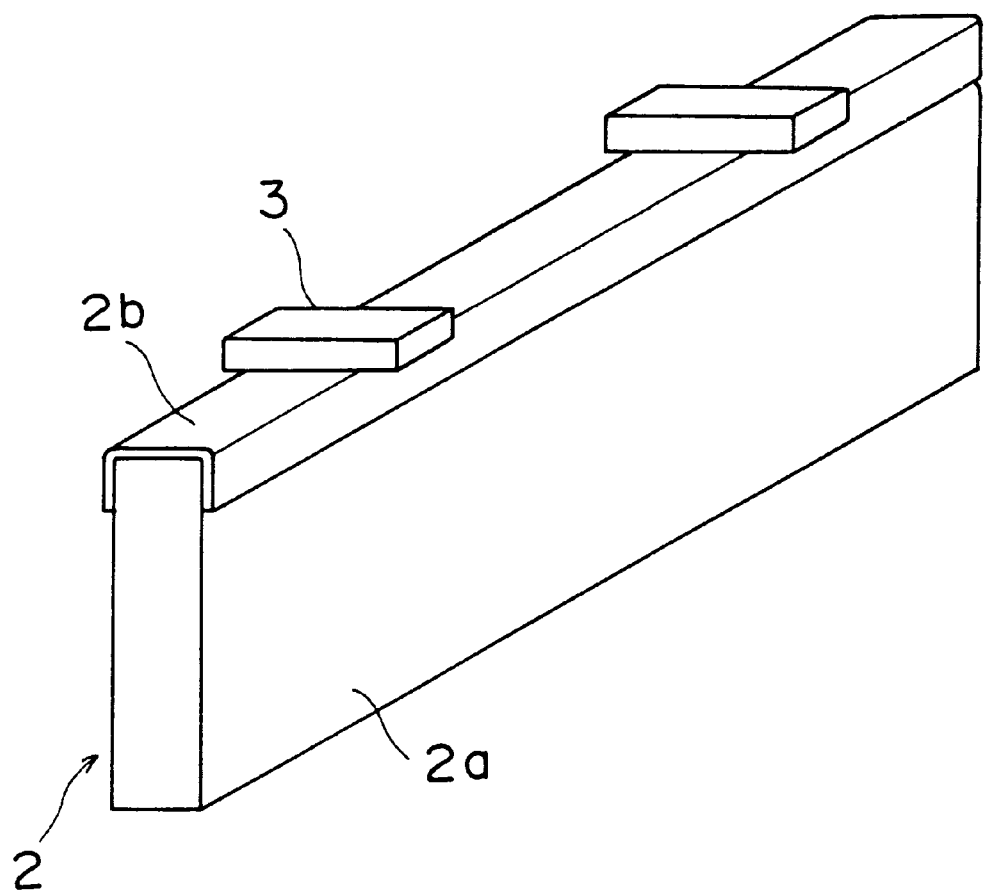
FIG. 2 is a perspective view showing an electronic component chip held in a conventional electronic component holder.
Figure 3:
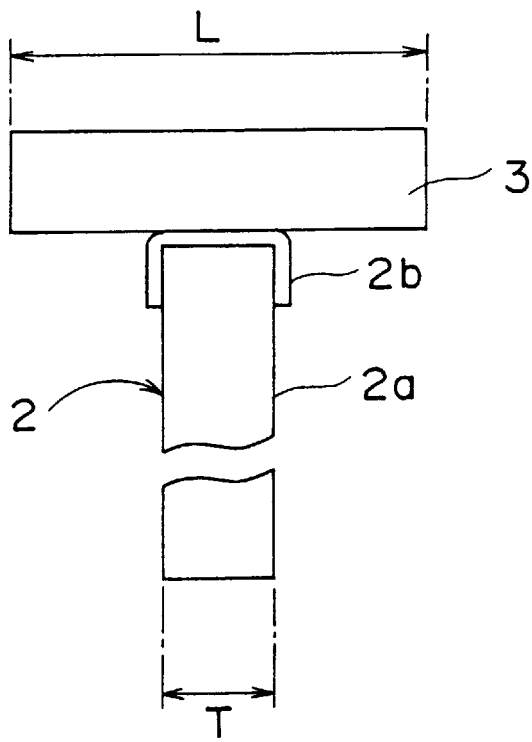
FIG. 3 is a schematic side view showing the dimensional relationship between a chip-type electronic component and the conventional electronic component holder.
Figure 4:
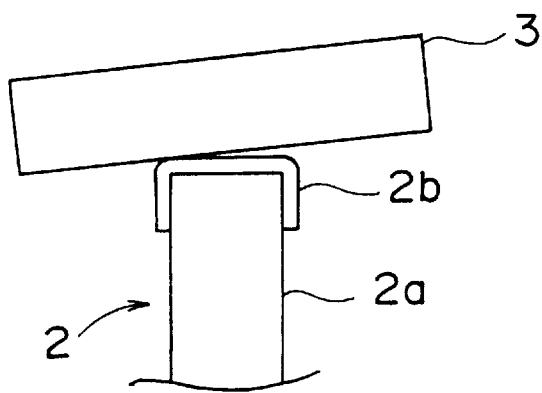
FIG. 4 is a partially cutaway side view for explaining the problems of the conventional electronic component holder.

FIG. 1 is a perspective view showing a state where an electronic component chip is held in an electronic component holder according to one embodiment of the present invention. An electronic component holder 11 is composed of a metal material such as aluminum.

Figure 5:
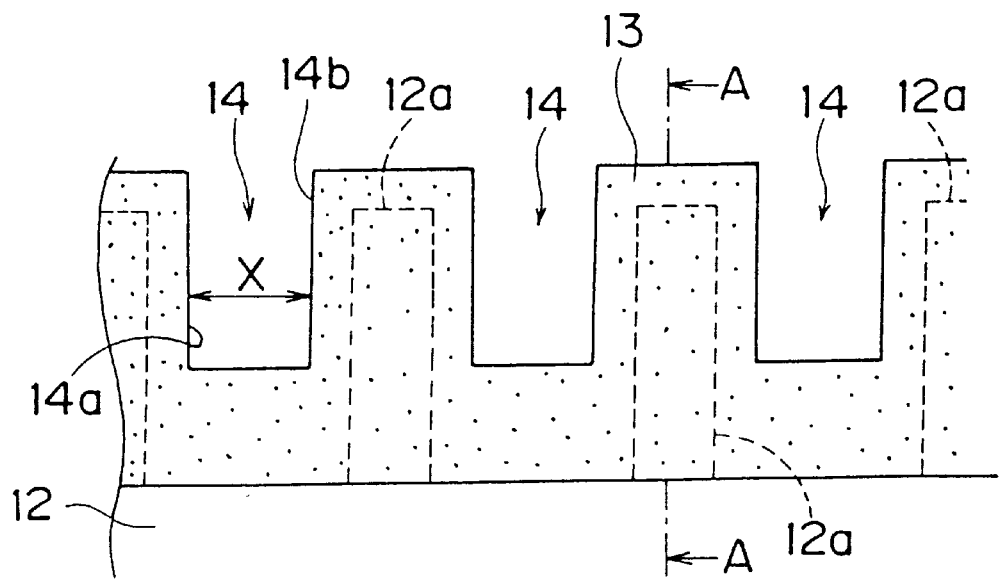
FIG. 5 is a partially cutaway front view showing in an enlarged manner a principal part of the electronic component holder according to the present embodiment.
Figure 6:
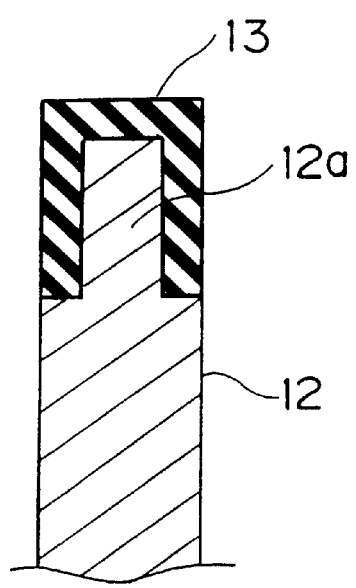
FIG. 6 is a partial cross sectional view taken along a line A—A shown in FIG. 5.

A supporting plate 12 actually has a plurality of projections so as to extend into an upper elastic rubber layer 13, although illustrated so as to have a substantially rectangular shape in FIG. 1. Specifically, a plurality of projections 12a extending upward are formed in an upper edge of the supporting plate 12, and the elastic rubber layer 13 is formed around the projections 12a, as shown in FIGS. 5 and 6.

The elastic rubber layer 13, which can be composed of natural rubber or synthetic rubber such as silicone rubber, is constructed in such a shape that a recess portion 14 is formed between the adjacent projections 12a. Specifically, the elastic rubber layer 13 is so constructed that the recess portion 14 having dimensions suited to contain an electronic component chip 15 shown in FIG. 1 is formed. The above described suitable dimensions are so selected that the distance X (see FIG. 5) between inner walls 14a and 14b opposed to each other of the recess portion 14 is equal to or slightly less than the width W of the electronic component chip 15. That is, it is desirable that when W is taken as the width of the electronic component chip 15, the width X of the recess portion 14 satisfies the relationship X=W−α (where α is the width of a clearance allowing the electronic component chip 15 to be held in and removed from the recess portion 14 by an external force).

Furthermore, the thickness T of the electronic component holder 11 must be made less than the length L of the electronic component chip 15, as shown in FIG. 1.

The recess portion 14 is formed in the above described dimensional relationship, thereby to make it possible to hold the electronic component chip 15 in the recess portion 14 in an accurate direction utilizing a frictional force of the surface of the elastic rubber layer 13 and the surface of the electronic component chip 15 in the electronic component holder 11. Although in the above described embodiment, the elastic rubber layer 13 is composed of silicone rubber which is easily formed, the elastic rubber layer 13 may be composed of another elastic material.

The thickness T of the electronic component holder must be such a thickness as not to degrade the rigidity as a jig and as not to interfere with processing of the electronic component. When outer electrodes made of a thick film are simultaneously formed on both end surfaces of the electronic component chip 15, for example, (the length L of the electronic component chip 15 minus the above described thickness T) must be not less than 0.5 mm.

Figure 7:
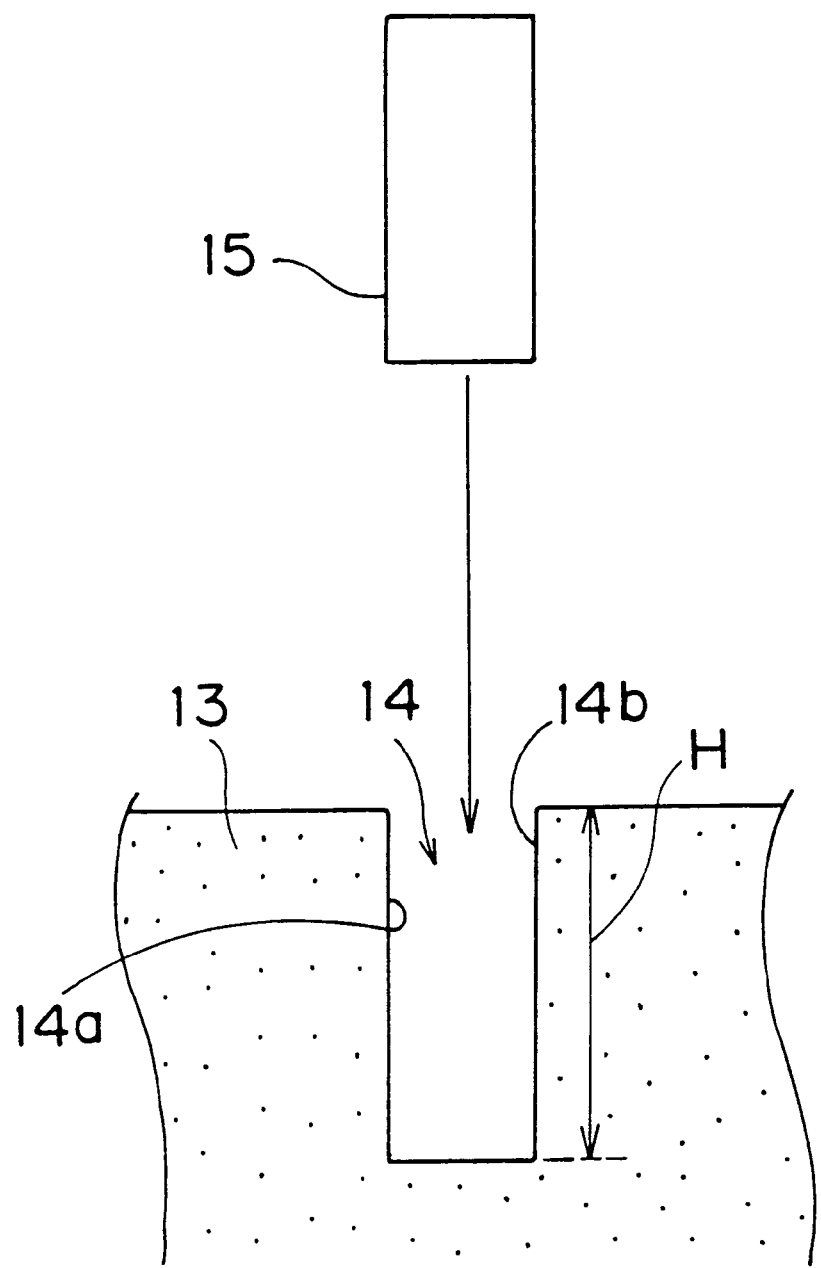
FIG. 7 is a partially cutaway front view for explaining the step of inserting the electronic component into the electronic component holder according to the present embodiment.

Furthermore, the depth H of the recess portion 14 can be arbitrarily determined without depending on the dimensions of the electronic component chip 15, as shown in FIG. 7. When an upper surface 15a in the state shown in FIG. 1 of the electronic component chip 15 is also subjected to processing, however, the depth H of the recess portion 14 must be so selected that the upper surface 15a of the electronic component chip 15 is projected upward. The depth H of the recess portion 14 is not limited to the same. It is preferable in terms of handling that the depth H of the recess portion 14 is so set that the upper surface 15a is slightly projected even if the electronic component chip 15 is completely forced into the recess portion 14.

MODIFIED EXAMPLES

Although in the above described embodiment, the elastic rubber layer 13 is so formed around the projections 12a projected upward of the supporting plate 12 composed of a metal so as to form the recess portion 14 between the adjacent projections 12a, a method of forming the recess portion 14 can be realized in various forms, as shown in FIGS. 8 to 13.

Figure 8:
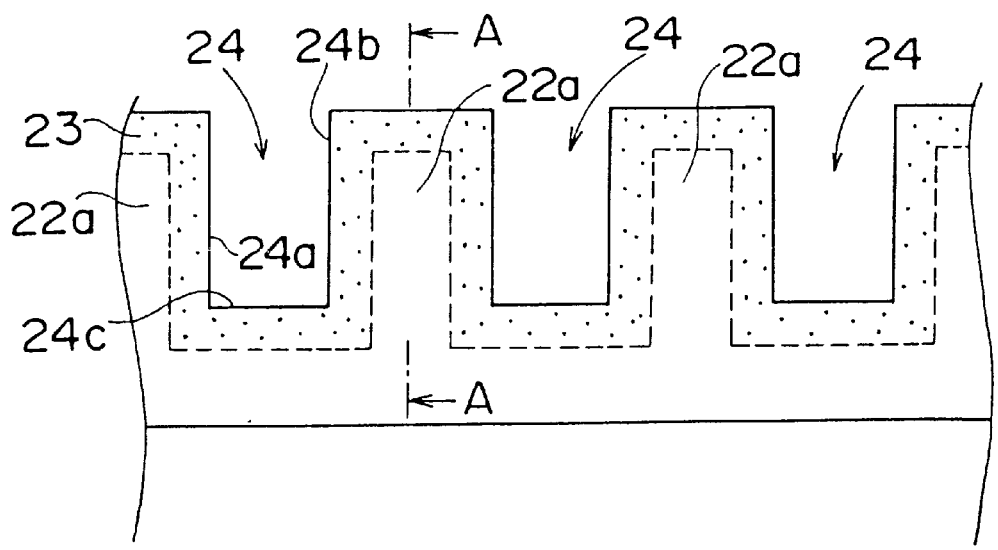
FIG. 8 is a partially cutaway front view showing a principal part of an electronic component holder in a first modified example.
Figure 9:
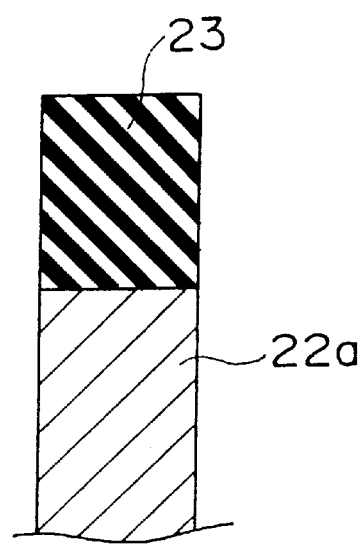
FIG. 9 is a partial cross sectional view taken along a line A—A shown in FIG. 8.

For example, in a modified example shown in FIGS. 8 and 9, a plurality of projections 22a extending upward are formed spaced apart from each other by a predetermined distance in an upper edge of a supporting plate 22. An elastic rubber layer 23 is so formed as to only form upper surfaces and a pair of side surfaces 24a and 24b opposed to each other with a recess portion 24 interposed therebetween, of the adjacent projections 22a and a bottom surface 24c of the recess portion 24. Specifically, as shown in FIG. 9, both major surfaces of the projection 22a are not covered with the elastic rubber layer 23.

Figure 10:
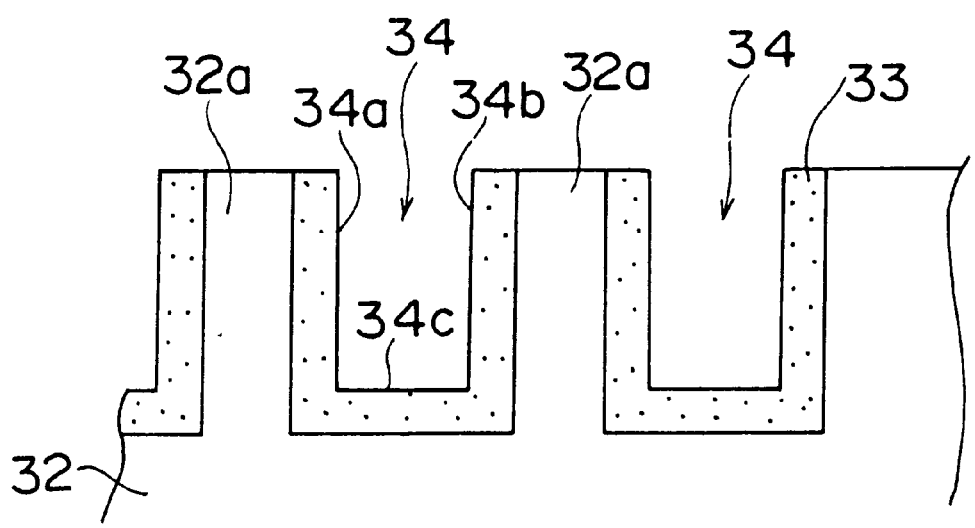
FIG. 10 is a partially cutaway front view showing in an enlarged manner a principal part of an electronic component holder in a second modified example.

Furthermore, in a modified example shown in FIG. 10, projections 32a extending upward are formed spaced apart from each other by a predetermined distance in an upper edge of a supporting plate 32, and only an inner surface of a recess portion 34 formed between the adjacent projections 32a is covered with an elastic rubber layer 33. Specifically, only a pair of side surfaces 34a and 34b opposed to each other and a bottom surface 34c of the recess portion 34 are formed with the elastic rubber layer 33.

Figure 11A:
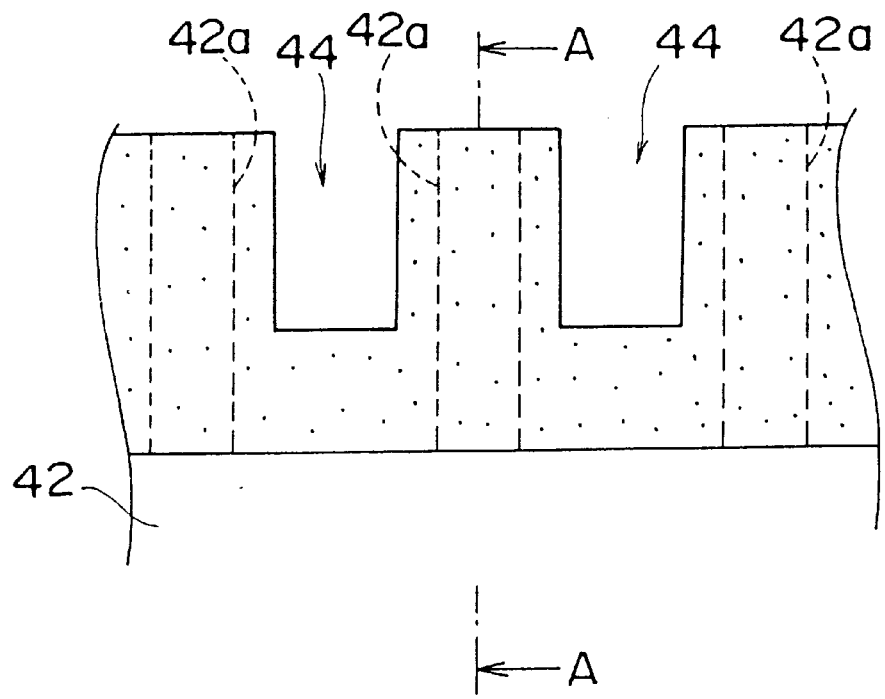
FIGS. 11A and 11B are respectively a partially cutaway front view for explaining an electronic component holder in a third modified example and a cross sectional view taken along a line A—A shown in FIG. 11A.
Figure 11B:
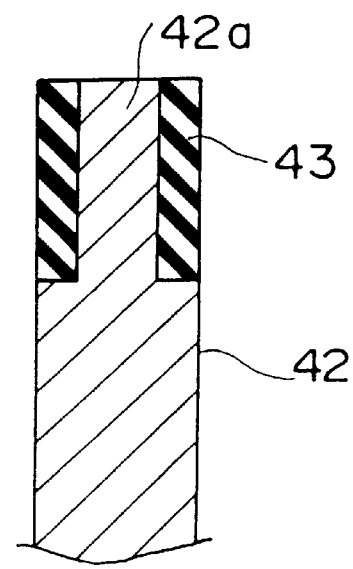

In a modified example shown in FIG. 11, a plurality of projections 42a projected upward are formed spaced apart from each other by a predetermined distance in a supporting plate 42 composed of a metal, and an elastic rubber layer 43 is so formed as to cover the projections 42a. The elastic rubber layer 43 is not so formed as to cover the upper surfaces of the projections 42a, as also apparent from FIG. 11B. Reference numeral 44 denotes a recess portion.

Figure 12A:
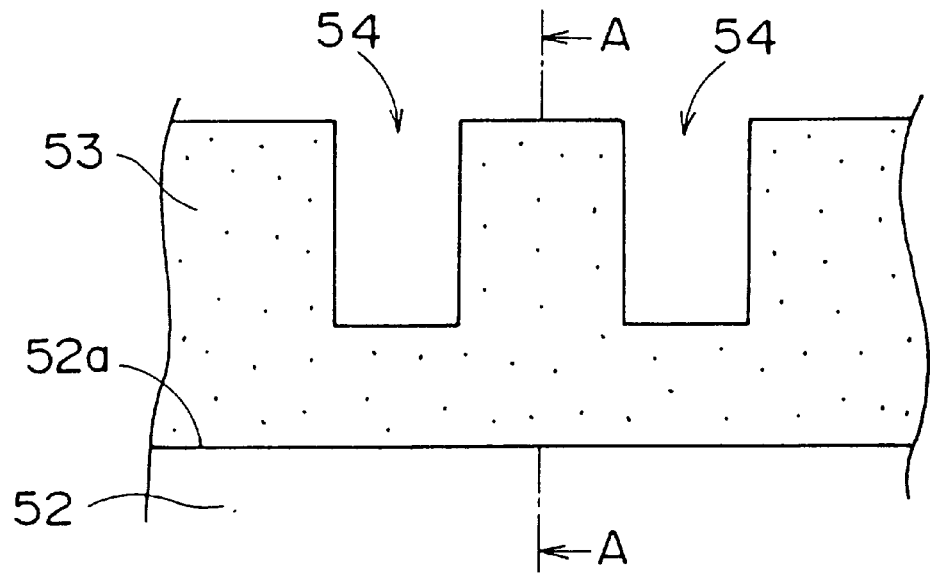
FIGS. 12A and 12B are respectively a partially cutaway front view for explaining an electronic component holder in a fourth modified example and a partial cross sectional view taken along a line A—A shown in FIG. 12A.
Figure 12B:
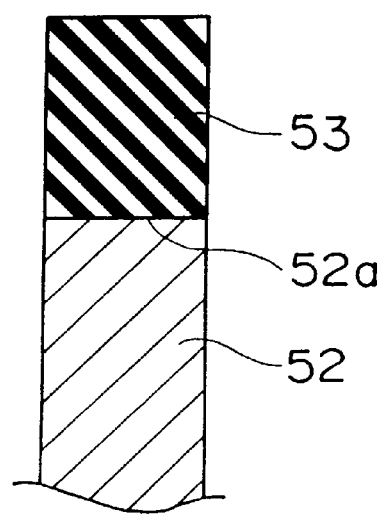

In a modified example shown in FIGS. 12A and 12B, a rubber plate 53 is affixed with adhesives to an upper end surface 52a of a supporting plate 52 composed of a metal. The rubber plate 53 has a plurality of recess portions 54 opening outward in its upper edge. Specifically, in the modified example shown in FIGS. 12A and 12B, the recess portion 54 in the shape as shown is formed in the rubber plate 53, to constitute an electronic component holding portion. Although in the above described respective modified examples, the recess portion is formed by affixing the elastic rubber layer to the peripheries of the upper projections in the supporting plate composed of a metal or surrounding the upper projections with the elastic rubber layer, thereby to increase the mechanical strength of the periphery of the electronic component holding portion, the peripheries of the recess portions 54 may be constituted by only the rubber plate 53, as in the modified example shown in FIGS. 12A and 12B.

Figure 13:
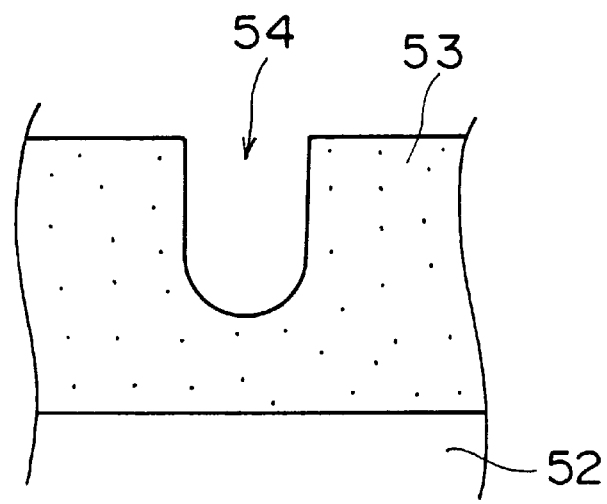
FIG. 13 is a partially cutaway, enlarged front view showing a modified example in which the shape of a recess portion is changed.

Furthermore, in a modified example shown in FIG. 13, an innermost part of a recess portion 54 is in the shape of a curved surface. As represented by the recess portion 54, the recess portion in the present invention may be formed in the shape of a curved surface on the bottom side, so long as it has at least one pair of inner side surfaces opposed to each other.

Figure 14:
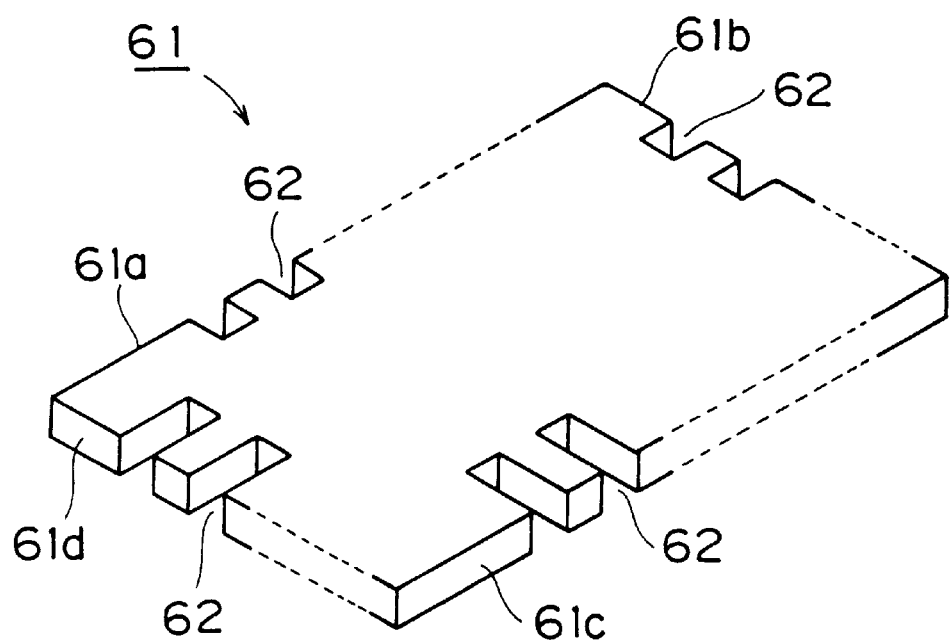
FIG. 14 is a perspective view showing a modified example in which electronic component holding portions are formed in four sides of a rectangular electronic component holder.

FIG. 14 shows still another modified example of the electronic component holder according to the present invention. In an electronic component holder 61, a plurality of recess portions 62 are respectively formed in edges 61a to 61d, thereby to constitute a plurality of electronic component holding portions. As also apparent from FIG. 14, in the present embodiment, electronic component holding portions may be formed in a plurality of edges of a rectangular electronic component holder.

Embodiment of Electronic Component Handling Method

In an electronic component handling method, an electronic component is handled using the above described electronic component holder. An embodiment of the electronic component handling method will be described in a case where the electronic component holder 11 shown in FIG. 1 is utilized.

First, the electronic component chip 15 is inserted as shown into the recess portion 14 serving as the electronic component holding portion of the electronic component holder 11. In such a manner, a conductive paste is applied to both end surfaces 15b and 15c of the electronic component chip 15 and baked while the electronic component chip 15 is held in the recess potion 14, thereby to make it possible to form outer electrodes so as to cover both the end surfaces 15b and 15c.

In the present embodiment, the conductive paste can be applied and baked while the electronic component chip 15 is held in the recess portion 14 in an accurate direction and stably, thereby to make it possible to form the outer electrodes in desired positions with high precision.

Although in the present embodiment, the above described electronic component holder 11 is used in the step of forming the outer electrodes, the step of handling the electronic component includes arbitrary other steps such as the step of measuring the electrical properties of the finished chip-type electronic component in addition to the step of forming the outer electrodes.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic component holder, comprising:
    a supporting plate; and
    at least one recess portion opening outward in at least one edge of said supporting plate to constitute an electronic component holding portion,
    wherein at least one pair of side surfaces of said recess portion opposed to each other and a bottom surface of said recess portion are composed of an elastic material, in combination with a chip electronic component having a length L and a width W held in said recess portion, wherein the a distance X between the pair of the opposed side surfaces of said recess portion satisfies the relationship X=W−α where α is the width of a clearance allowing the chip electronic component to be elastically held in or removed from the recess portion;

said supporting plate having a plurality of projections formed on at least one end surface thereof, and an elastic material layer formed on side surfaces opposed to each other of an adjacent pair of said projections, said recess portion being formed between the side surfaces, on which the elastic material layer is formed, of said projections, and wherein the elastic material layer is further formed on top end surfaces of said projections.

2. The electronic component holder according to claim 1, wherein a thickness T of said supporting plate is less than the length L of said chip electronic component, whereby said chip electronic component can be held in said recess portion with both ends of said chin electronic component protecting away from said electronic component holder.

3. The electronic component holder according to claim 1, wherein said elastic material comprises an elastic plate which is fixed to the supporting plate, and said recess portion being formed in said elastic plate.

4. The electronic component holder according to claim 1, wherein said pair of side surfaces are substantially orthogonal to the bottom surface.

5. The electronic component holder according to claim 1, wherein said bottom surface is in the shape of a curved surface.

6. The electronic component holder according to claim 1, wherein said at least one recess portion is a plurality of said recess portions that are formed in a corresponding plurality of the edges of said supporting plate.

7. The electronic component holder according to claim 1, wherein said projections are surrounded with the elastic material layer.

8. The electronic component holder according to claim 1, wherein said opposed side surfaces of said recess portion are substantially parallel to each other.

9. In combination, a chip electronic component having a length L and a width W, and an electronic component holder, said electronic component holder comprising:

a supporting plate; and at least one recess portion opening outward in at least one edge of said supporting plate to constitute an electronic component holding portion, wherein at least one pair of side surfaces of said recess portion opposed to each other and a bottom surface of said recess portion are composed of an elastic material; and wherein a thickness T of said supporting plate is less than the length L of said chip electronic component, whereby said chip electronic component can be held in said recess portion with both ends of said chip electronic component projecting away from said electronic component holder;

said supporting plate having a plurality of projections formed on at least one end surface thereof, and an elastic material layer formed on side surfaces opposed to each other of an adjacent pair of said projections, said recess portion being formed between the side surfaces, on which the elastic material layer is formed, of said projections, and wherein the elastic material layer is further formed on top end surfaces of said projections.

10. The electronic component holder according to claim 9, wherein said elastic material comprises an elastic plate which is fixed to the supporting plate, and said recess portion being formed in said elastic plate.

11. The electronic component holder according to claim 9, wherein said pair of side surfaces are substantially orthogonal to the bottom surface.

12. The electronic component holder according to claim 9, wherein said bottom surface is in the shape of a curved surface.

13. The electronic component holder according to claim 1, wherein said at least one recess portion is a plurality of said recess portions that are formed in a corresponding plurality of the edges of said supporting plate.

14. The electronic component holder according to claim 9, wherein said projections are surrounded with the elastic material layer.

15. The electronic component holder according to claim 9, wherein said opposed side surfaces of said recess portion are substantially parallel to each other.

* * * * *